United States Patent [19]

Bertin

[11] Patent Number: 6,111,780
[45] Date of Patent: Aug. 29, 2000

[54] RADIATION HARDENED SIX TRANSISTOR RANDOM ACCESS MEMORY AND MEMORY DEVICE

[75] Inventor: Robert Christian Bertin, Fairfax, Va.

[73] Assignee: Lockheed Martin Corporation, Bethesda, Md.

[21] Appl. No.: 09/325,645

[22] Filed: Jun. 4, 1999

Related U.S. Application Data

[63] Continuation-in-part of application No. 09/090,946, Jun. 5, 1998, abandoned.

[51] Int. Cl.[7] .................................................. G11C 11/00
[52] U.S. Cl. ........................................ 365/154; 365/156
[58] Field of Search .................................. 365/154, 156; 257/371, 372

[56] References Cited

U.S. PATENT DOCUMENTS

| | | |
|---|---|---|
| 4,387,444 | 6/1983 | Edwards . |
| 4,467,451 | 8/1984 | Moyer . |
| 4,623,989 | 11/1986 | Blake ........................................ 365/156 |
| 4,809,226 | 2/1989 | Ochoa, Jr. . |
| 4,852,060 | 7/1989 | Rockett . |
| 4,956,814 | 9/1990 | Houston .................................. 365/154 |
| 5,053,848 | 10/1991 | Houston et al. . |
| 5,111,429 | 5/1992 | Whitaker . |
| 5,126,970 | 6/1992 | Haq . |
| 5,135,882 | 8/1992 | Karniewicz . |
| 5,175,605 | 12/1992 | Pavlu et al. . |
| 5,301,146 | 4/1994 | Hama . |
| 5,307,142 | 4/1994 | Corbett et al. . |
| 5,311,070 | 5/1994 | Dooley . |
| 5,406,513 | 4/1995 | Canaris et al. . |
| 5,453,949 | 9/1995 | Wiedmann et al. ...................... 365/154 |
| 5,485,420 | 1/1996 | Lage et al. . |
| 5,504,703 | 4/1996 | Bansal . |
| 5,525,923 | 6/1996 | Bialas, Jr. et al. . |
| 5,559,461 | 9/1996 | Yamashina et al. . |
| 5,572,460 | 11/1996 | Lien . |
| 5,631,863 | 5/1997 | Fechner et al. . |
| 5,764,089 | 6/1998 | Partovi et al. . |
| 5,870,332 | 2/1999 | Lahey et al. . |

FOREIGN PATENT DOCUMENTS

| | | |
|---|---|---|
| 0 357 980 A2 | 3/1990 | European Pat. Off. . |
| 0 432 846 A1 | 6/1991 | European Pat. Off. . |

OTHER PUBLICATIONS

"On–Chip Receiver Featuring Fall–Through Radiation–Hardened Latching", IBM Technical Disclosure Bulletin, vol. 32, No. 12, May 1990, pp. 389–392.

K. Jos Hass et al., "Mitigating Single Event Upsets From Combinational Logic", 7th NASA Symposium on VLSI Design 1998, pp. 4.1.1–4.1.10.

Dr. David G. Mavis et al., "Temporally Redundant Latch For Preventing Single Event Disruptions In Sequential Integrated Circuits", Technical Report P8111.29 published by Mission Research Corporation on Sep. 8, 1998, Revised on Oct. 8, 1998, pp. 1–40.

*Primary Examiner*—Huan Hoang
*Attorney, Agent, or Firm*—Lane Aitken and McCann

[57] ABSTRACT

A memory device can include a radiation hardened, static random access memory (SRAM) cell having a first inverter pair including a first PFET and a first NFET coupled in series drain to drain by a resistor whose resistance can be an order of magnitude (i.e., ten times) larger than the source to drain resistance of the first PFET, a second inverter pair including a second PFET and a second NFET coupled in series drain to drain by a resistor whose resistance can be an order of magnitude larger than the source to drain resistance of the second PFET, the first or second PFET can include a P+ drain difflusion in an NWELL where a portion of the gate can overlie the P+ drain diffusion, a first pass gate PFET coupled to the gate of the first PFET, the gate of the first NFET, and the P+ drain diffusion of the second PFET, and a second pass gate PFET coupled to the gate of the second PFET, the gate of the second NFET, and the P+ drain diffusion of the first PFET.

21 Claims, 3 Drawing Sheets

RADIATION HARDENED SIX TRANSISTOR RANDOM ACCESS MEMORY AND MEMORY DEVICE

RELATED APPLICATION

This is a Continuation-In-Part Application of U.S. patent application Ser. No. 09/090,946, filed Jun. 5, 1998, abandoned.

FIELD OF THE INVENTION

The present invention relates generally to the field of electronic circuits, and more particularly to static random access memory (SRAM) circuits and improved radiation hardened SRAM devices and methods of operation.

BACKGROUND OF THE INVENTION

Operation of an electronic system can include storage of data to a memory and retrieval of the data from the memory. Electronic memories can include an array of storage cells where each cell is capable of storing a bit of data. In such a memory, information can be placed "randomly" into, or taken out of, each storage element as required. This type of electronic memory is commonly referred to as a random access memory (RAM).

An advantage of RAM is that access time is the same for any bit in the matrix. In a shift register serial memory by comparison, access time depends on the position of the bit at the moment of access. A disadvantage of RAM as compared to read only memory (ROM), is that RAM is volatile, i.e. all stored information can be lost if a power supply fails. This is why data is often stored on auxiliary memory devices such as, e.g., disk or tape.

One type of RAM is a static random access memory (SRAM). SRAMs are favored where memory access times must be kept to a minimum. SRAMs also have relatively low power requirements and are commonly used in battery powered units, including portable computers.

Basically, an SRAM is an integrated circuit that stores data in a binary form (e.g., "1" or "0") in a number of cells. The basic storage cell in a RAM can be fabricated in metal oxide semiconductor (MOS) and bipolar transistor technologies. The most widely used RAMs use MOS transistors because they provide the highest component density and hence, more bits can be stored for a given chip size.

Metal oxide semiconductor (MOS) originally described transistor gates which were fabricated using metal over a thin oxide layer. AMOS transistor can also be commonly referred to as a field effect transistor (FET) or as a MOSFET. Today the term is applied more broadly to include transistors with gates of polysilicon over oxide. NMOS, PMOS and CMOS are three exemplary types of MOS technology. "NMOS" refers to n-type MOS transistors. "N-type" refers to a dopant introduced into silicon to enhance its ability to conduct electrons, which are negatively charged particles. "PMOS" uses a p-type dopant which enhances the conduction of electron "holes," which are positive charges. "CMOS" means complementary MOS and involves the fabrication of both PMOS and NMOS devices on a single substrate. Usually, PMOS devices are fabricated in n-type wells while NMOS devices are formed within primarily p-type substrate. NMOS has long prevailed over PMOS as a technology of choice, while CMOS has advanced rapidly as advantages of combining PMOS and NMOS have often outweighed the complexity of combining them. A PMOS can also be referred to as a PFET and an NMOS as an NFET.

Typically, the cells of an SRAM can be arranged in an array so that individual cells can be addressed and accessed. The array can be thought of as rows and columns of cells. Each row includes a word line that interconnects cells on the row with a common control signal. Similarly, each column includes a complementary bit line pair that is coupled to at most one cell in each row. Thus, the word and bit lines can be controlled so as to individually access each cell of the array.

Specifically, memory cells can be arranged in a rectangular array to permit two dimensional addressing. A basic RAM can include the rectangular array of storage cells, two decoders, one each for addressing each of the dimensions of the array (i.e. the word lines and bit line pairs) of storage cells, write amplifiers for driving the memory, and sense amplifiers to detect (i.e. read) the stored digital information. For example, a 4096-word by 1-bit (4-kb×1) static RAM may illustratively include a 64 word line by 64 bit line pair two dimensional memory array, a 6-to-64 line column decoder, a 6-to-64 line row decoder, a write enable circuit, a sense circuit, and other control circuits.

To read data out of a cell, the output of a cell can be accessed by selecting the word line associated with the cell. In order to read, the write enable circuit can be grounded, i.e. set to 0. A complementary bit line pair can be connected to each cell in a given column. When the word line is activated for the selected cell, the logic level (i.e. 1 or 0) stored in the flip-flops or inverters of the selected cell can cause current to flow through the bit lines, setting the voltage on the bit line. A sense amplifier can detect and amplify the relative voltages on the bit lines in an output that indicates the contents of the selected cell. An input/output device for the array, such as a transistor, can pass the voltage on the bit lines for the selected cell or the output of a selected sense amplifier to an input/output pad for communication with another chip such as a processor of a computer or other electronic system associated with the SRAM. In a write operation, data can be passed from the input/output pads of the SRAM to the internal bit lines by the input/output device of the array for storage in the transistor flip-flops or inverters of the selected cell.

Memory devices can be used in satellites and in other computer equipment which can be placed in environments which are highly susceptible to radiation. For example, a memory cell in a satellite in a space environment, can be exposed to a radiation-induced soft error or single event upset (SEU) when a cell is struck by high energy particles. A soft error or single event upset typically is caused by electron-hole pairs created by, and along the path of, a single energetic particle as it passes through an integrated circuit such as a memory. Should the energetic particle generate the critical charge in the critical volume of a memory cell, then the logic state of the memory is upset. This critical charge, by definition, is the minimum amount of electrical charge required to change the logic state of the memory cell. The critical charge may also enter the memory through direct ionization from cosmic rays.

SEU typically results from alpha particles (helium nuclei), beta particles or gamma rays impacting a low-capacitance node of a semiconductor circuit. An example of a SEU of an inverter is illustratively described. An inverter includes a PMOS transistor and an NMOS transistor with their drains coupled and is used to generate complementary signals. When an alpha particle strikes bulk semiconductor material in the PMOS transistor, it generates electron-hole pairs. Assuming that the NMOS transistor is on and that the PMOS transistor is off, the holes which collect at the coupled drain can change the voltage at an output node coupled to the drains from a logic low to a logic high. Electrons will diffuse toward the circuit supply voltage through the PMOS. A charge generating energetic particle hit on the NMOS transistor has the opposite effect, with positive charges drifting towards ground and negative charges collecting at the drain output, thus possibly changing the logic state of the inverter with its NMOS transistor off and its PMOS transistor on. In P-substrate, bulk CMOS technologies with PMOS devices formed in an NWELL, the effect of a charge particle hitting an NMOS transistor diffusion is typically worse than when a charged particle hits a PMOS transistor diffusion in an NWELL.

As will be appreciated by those skilled in the art, when a heavy ion traverses a node within a memory storage cell, the ion can force the node from its original state to an opposite state for a period of time. This change of state can be due to the charge that the heavy ion deposits as it passes through the silicon of a MOS transistor of the memory cell. If this node is held in the opposite state for a period of time longer than the delay around a feedback loop of the memory cell, the cell can switch states and the stored data can be lost. The period of time which the node is held in its opposite state can depend on several factors including the charge deposited, the conductance of the transistors of the memory cell and the delay around the feedback loop of the memory cell.

Attempts have been made to radiation harden SRAM memory cells to reduce the susceptibility of cells to radiation induced upsets.

One way to prevent an SEU is to increase the conductance of transistors. In order to increase conductance, the size of the transistors must be increased. An increase in size of a memory cell by greater than ten times could be necessary. Such an increase would not be practical, since it is generally preferred that transistors be of minimal size in order to minimize the area of a memory cell.

A more economical solution can be to increase feedback delay. Increasing the feedback delay can give an "on" transistor, time to remove the deposited charge before the voltage state change can propagate sufficiently to establish regenerative feedback which could result in an upset. Feedback delay can be increased by adding resistors between the drains (or sources) and gates of the cell. These added resistors are commonly referred to as cross-coupled resistors.

Although cross-coupled resistors have proven effective in increasing the critical charge necessary to upset a memory cell, the resistors increase delay in the feedback loop to prevent a memory cell upset due to a heavy particle hit. Unfortunately, the resistors also resist a deliberate write and therefore can increase the write time of the memory cell. For a typical single event upset, write time can increase more than five times as compared to that without cross-coupled resistors.

In addition, cross-coupled resistors are often made using polysilicon with sheet resistance in a region where the temperature coefficient is negative and large. In a typical design, this temperature coefficient can cause write times to increase radically with decreases in temperature.

Another deficiency of conventional approaches, is that in order to gain immunity, radiation hardening of SRAM cells can reduce the rate of cell response. For example, when a particle strikes a node and deposits a charge, the cell can be too slow to respond and does not change state because a resistor in series with cross-coupled inverters can create an RC delay in combination with gate capacitance of the inverters.

This conventional approach has several deficiencies. Such a memory cell can require a resistor in series with cross coupled inverters. The resistor can be formed with a large resistance value and a close tolerance. Cell performance can be dominated by this resistance value, which can be difficult to control in the manufacturing process. As cell geometries go to ever smaller feature sizes (e.g., $0.5\mu$ and below), gate capacitance can become so low that the resistance needed can be so large that it cannot be made to fit in a reasonably small area. Further, cell write performance can become slower, especially in cold temperature conditions if the resistor is implemented with a negative temperature coefficient.

It is desired that the present invention provide a radiation hardened SRAM cell which can easily be implemented using conventional complementary metal oxide semiconductor (CMOS) processes, and which has performance speed comparable to an SRAM cell that has not been radiation hardened.

SUMMARY OF THE INVENTION

The above mentioned deficiencies of conventional memory devices and other challenges are addressed by the present invention and will be understood by careful review of the following specification. A method and memory device for a radiation hardened SRAM memory is described which uses an improved memory cell.

In particular, an illustrative embodiment of the present invention includes a memory device with an array of word lines and complementary bit line pairs. A number of memory cells are located at the intersection of selected word lines and bit line pairs. A sense amplifier is coupled to the complementary bit line pairs. In an embodiment of the invention, the memory device further includes an improved SRAM memory cell.

Basically, an embodiment of the improved memory cell can include six transistors, including two cross coupled inverter pairs and two PFET gate transistors for writing to and reading from the cross coupled inverter pairs. Resistors can be used to isolate N+ diffusions from the P+ diffusions in each inverter pair, and a gate to drain overlap can be included in the remaining nodes of the cell so that Miller effect capacitance can provide an additional single event upset immunity, without an appreciable increase in write delay.

In an embodiment of the invention, a radiation hardened, CMOS, static, random access memory cell can include a first inverter pair including a first PFET and a first NFET coupled in series drain to drain by a resistor whose resistance can be an order of magnitude larger than the source to drain resistance of the first PFET, e.g., the order of magnitude, as would be apparent to those skilled in the art, could include a range of magnitude from the source to drain resistance value up to approximately ten times larger than the source to drain resistance, the first PFET including a P+ drain diffusion in an NWELL where a portion of the gate can overlie the P+ drain diffusion, a second inverter pair including a second PFET and a second NFET coupled in series drain to drain by a resistor whose resistance can be an order of magnitude larger than the source to drain resistance of the second PFET, the second PFET can include a P+ drain diffusion in an NWELL where a portion of the gate can overlie the P+ drain diffusion, a first pass gate PFET coupled to the gate of the first PFET, the gate of the first NFET, and the P+ drain diffusion of the second PFET, and a second pass gate PFET coupled to the gate of the second PFET, the gate of the second NFET, and the P+ drain diffusion of the first PFET.

In an embodiment of the memory cell the portions of the gate overlying the P+ drain diffusion provide additional capacitance.

In another embodiment, the additional capacitance is between 0.2 and 0.5 pico-farads.

Another embodiment of the invention includes a radiation hardened, CMOS, static, random access memory cell, having a first inverter including a first PFET and a first NFET having commonly coupled gates and separate drains, the drain of the first PFET including a P+ drain diffusion in an NWELL with a portion of the gate overlying the P+ drain diffusion, a second inverter including a second PFET and a second NFET having commonly coupled gates and separate drains, the drain of the second PFET including a P+ drain diffusion in an NWELL with a portion of the gate overlying the P+ drain diffusion, first and second resistors coupling the P+ drain diffusions of the first and second PFETS respectively to the drains of the first and second NFETS, a first pass gate PFET having a drain coupled to the commonly coupled gates of the first inverter and the P+ drain diffusion of the second PFET, and a second pass gate PFET having a drain coupled to the commonly coupled gates of the second inverter and the P+ drain diffusion of the first PFET.

In an embodiment of the invention, each of the first and second PFETS have a source to drain resistance that is smaller in value than a value of a corresponding one of the resistors.

In another embodiment, the value of each of the resistors is an order of magnitude larger than the source to drain resistance of each of the first and second PFETS.

In yet another embodiment, the value of each of the resistors is selected to raise an immunity of the memory cell to single event upset.

In another embodiment, the portions of the gate overlying the P+ drain diffusion provide additional capacitance.

In another embodiment, the additional capacitance is selected to raise an immunity of the cell to single event upset.

In another embodiment, the additional capacitance is 0.2–0.5 pico-farads.

In another embodiment, an apparatus that includes an electronic system and a memory device is provided. The memory device uses radiation hardened SRAM memory cells.

In another embodiment, a method for storing data in an exemplary radiation hardened SRAM memory cell of a memory device is described. Data can be latched in a sense amplifier of the memory device. The method can convert logic levels of the data in the sense amplifier to different logic levels for the memory cells. The method can further store the data in the selected SRAM memory cell.

In another embodiment, a method for reading data from a memory device using a radiation hardened memory cell can be provided.

In another embodiment, a method for reading and writing data in a memory device using a radiation hardened SRAM memory cell can be provided. The method can provide a technique for reading from or writing to a cell of the memory device.

A method for increasing the immunity of a system to SEU comprising the steps of providing a processor, providing a memory coupled to the processor, wherein the memory includes a radiation hardened, CMOS, static, random access memory cell raising immunity of the memory cell by selecting additional capacitance provided by the portions of the gate overlying the P+ drain diffusion or selecting the resistors such that the resistors are an order of magnitude larger than the source to drain resistance of each of the first and second PFETS.

In another embodiment, a method of making a radiation hardened storage cell is described including the steps of providing cross-coupled inverters, forming a resistor between drains of the NFET and PFET of each inverter, forming an overlap capacitance between the gate and drain of the POET of each inverter, and wiring the drains of the PFET to the gates of the NFET and PFET of the other inverter.

In another embodiment, a method of making a memory device including the steps of providing an array of cells, coupling a word line decoder to gates of the passgate transistors, coupling a source/drain region of the passgate transistors to bitlines, and coupling the bitlines to a column decoder.

In another embodiment, a method of operating a radiation hardened storage cell includes sustaining a particle hit on a node of the storage cell which changes the logic state at the output of an inverter of the storage cell, recovering from a critical charge deposited on the circuit as a result of an SEU event on a circuit node, and increasing RC delay slowing feedback propagation through cross-coupled inverter pair allowing more time for recovery wherein write cycle time is not appreciably affected.

In an embodiment of the invention, the method of operation can include increasing the immunity of critical charge deposition and decreasing the voltage change on the struck node by increasing capacitance on an inverter source/drain region, limiting the amount of voltage drop using a resistive barrier to protect against N+ transistor hits, or generating additional charge from overlap capacitance between gate and drain regions of cross-coupled inverters wherein some of the voltage change from the particle hit can be coupled through said overlap capacitance splitting deposited charge between opposing nodes of the cross-coupled inverters.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digits in the corresponding reference number.

BRIEF DESCRIPTION OF THE DRAWINGS

The foregoing and other features and advantages of the invention will be apparent from the following, more particular description of a preferred embodiment of the invention, as illustrated in the accompanying drawings.

DETAILED DESCRIPTION OF THE INVENTION

The preferred embodiment of the invention is discussed in detail below. While specific implementations are discussed, it should be understood that this is done for illustration purposes only. A person skilled in the relevant art will recognize that other components and configurations may be used without parting from the spirit and scope of the invention.

The illustrative embodiments described herein can concern electrical circuitry which can use voltage levels to represent binary logic states--namely, a "high" logic level and a "low" logic level. Further, electronic signals used by the various embodiments of the present invention are generally considered active when they are high, however, an asterisk (*) following the signal name in this application can indicate that the signal is negative or inverse logic. Negative or inverse logic can be considered active when the signal is low.

The present invention is directed to an improved storage cell. The storage cell can be used in any of a memory, a register file, a register and a latch. This application illustratively describes the storage cell in its use as part of a memory.

While FIGS. 2 and 3 below are illustrated with MOS devices, the same principles apply when using bipolar transistors. The storage cell of the present invention is described using CMOS type transistors. The cell can also be constructed, e.g., using only NMOS or only PMOS transistors, or using bipolar transistors. Using bipolar transistors, PFETs can be replaced with PNP type transistors, and NFETs can be replaced with NPN type transistors, and references to source regions can be used to refer to emitters and drains can be equated with a collector of the bipolar transistor.

Figure 1:
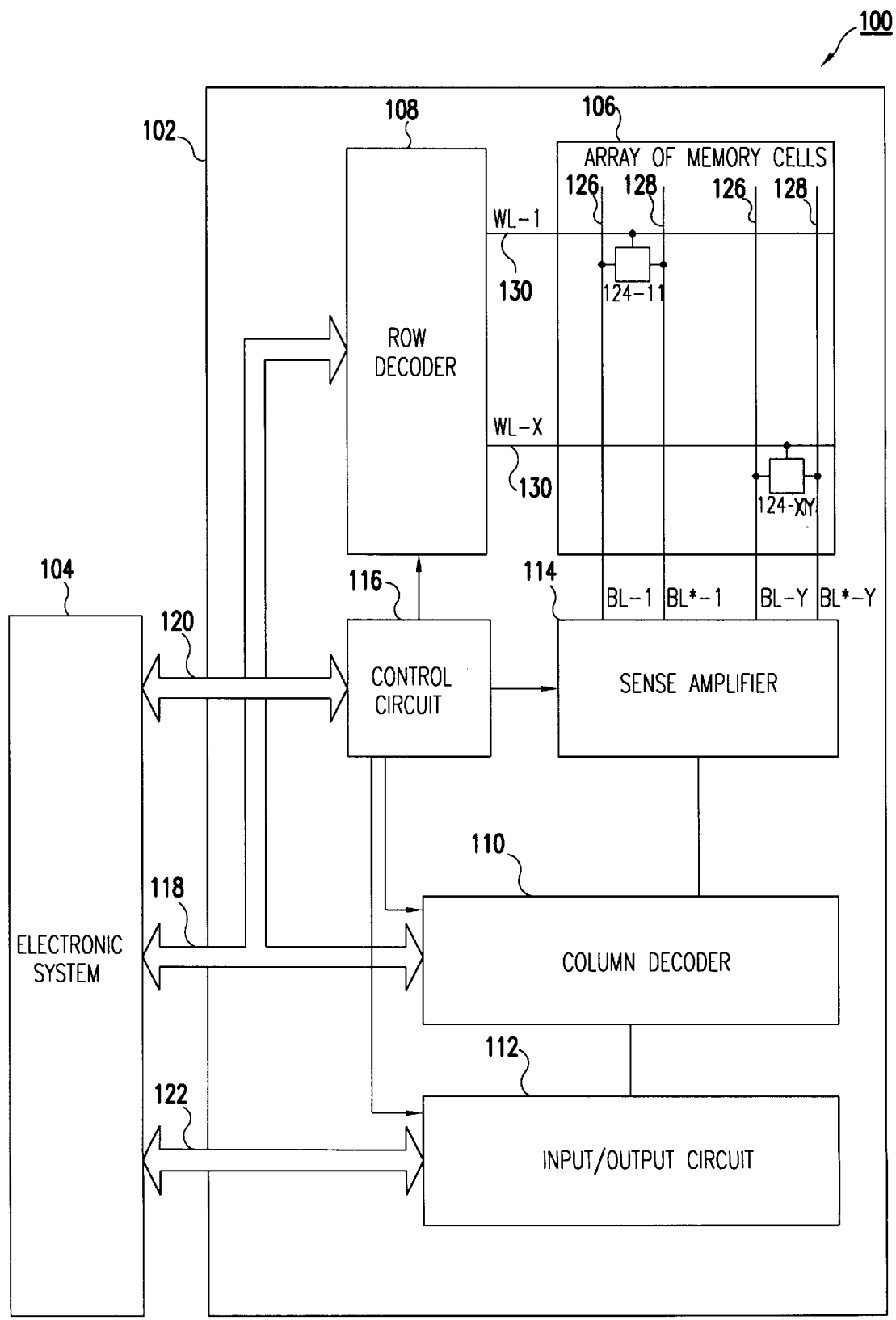
FIG. 1 is a block diagram of an exemplary memory device according to the present invention.

FIG. 1 depicts a block diagram 100 of an exemplary embodiment of the present invention. Block diagram 100 includes an electronic system 104 coupled to a memory device 102. Electronic system 104 can include, for example, a microprocessor, memory controller, a chip set or other appropriate system that stores data in a memory device. Electronic system 104 can be coupled to row decoder 108 of memory device 102 through address lines 118. Address lines 118 can also couple electronic system 104 to a column decoder 110. Control lines 120 couple electronic system 104 to a control circuit 116. Finally, input/output lines 122 couple electronic system 104 to an input/output circuit 112.

Memory device 102 can further include a sense amplifier 114 and an array of memory cells 106. Array of memory cells 106 includes a number of word lines, WL-1 130 through WL-X 130, a number of bit lines, BL-1 126 through BL-Y 126, and a number of complementary bit lines, BL*-1 128 through BL*-Y 128. Array of memory cells 106 is constructed so as to use a dynamic cell plate sensing scheme wherein each bit line, BL-i 126, is associated with a complementary bit line, BL*-i 128, to be used in reading and writing data into a memory cell. To this end, bit lines BL-1 126 through BL-Y 126 and bit lines BL*-1 128 through BL*-Y 128 are coupled in complementary pairs (referred to as "bit line pairs") to sense amplifier 114. Further, word lines WL-1 130 through WL-X 130 are coupled to row decoder 108.

Memory device 102 can be controlled by control circuit 116. Control circuit 116 can be coupled to row decoder 108, sense amplifier 114, column decoder 110, and input/output circuit 112.

Array of memory cells 106 can include a number of memory cells 124-11 through 124-XY. Memory cell 124-11 is described herein by way of example. It is understood that the remaining memory cells are constructed in similar fashion.

Figure 2:
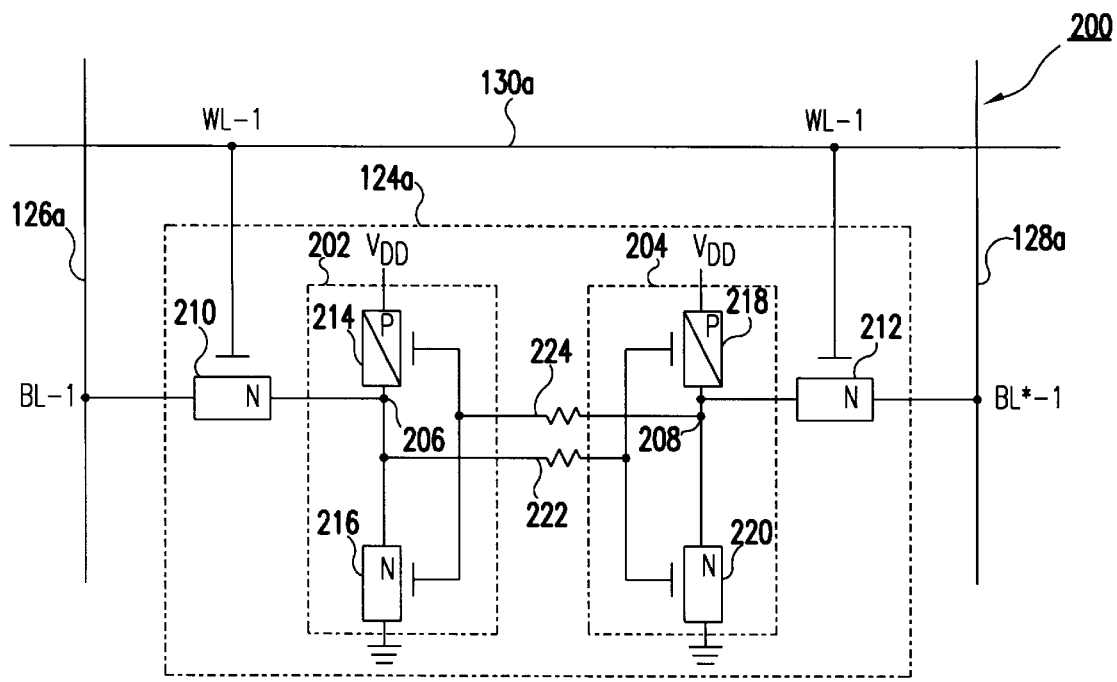
FIG. 2 is a schematic diagram depicting a conventional SRAM cell.

Memory cell 124-11 in a conventional SRAM 124a is illustrated in FIG. 2. FIG. 2 depicts a schematic drawing 200 that illustrates a common resistive coupling approach to radiation hardening a CMOS random access memory (RAM) cell 124a. Schematic drawing 200 includes two CMOS inverters 202 and 204 and lightly doped polysilicon resistors 222 and 224 formed in the feedback paths between CMOS inverters 202 and 204.

First CMOS inverter 202 includes a p-channel transistor 214 and an n-channel transistor 216 coupled together at a source/drain region of transistors 214, 216, referred to as node 206. Node 206 is coupled to a first terminal of resistor 222. A second source/drain region of p-channel transistor 214 is coupled to source voltage VDD, and a second source/drain region of n-channel transistor 216 is coupled to ground. The gates of transistors 214 and 216 are coupled together and coupled to a first terminal of resistor 224. Schematic diagram 200 further includes an n-channel pass transistor 210 including a gate that is coupled to word line WL-1 130a, a first source/drain region that is coupled to bit line BL-1 126a and a second source/drain region that is coupled to the node 206.

Second CMOS inverter 204 includes a p-channel transistor 218 and an n-channel transistor 220 coupled together at a source/drain region of transistors 218, 220, referred to as node 208. Node 208 is coupled to a second terminal of resistor 224. A second source/drain region of p-channel transistor 218 is coupled to source voltage VDD, and a second source/drain region of n-channel transistor 220 is coupled to ground. The gates of transistors 218 and 220 are coupled together and coupled to a second terminal of resistor 222. Schematic diagram 200 further includes an n-channel pass transistor 212 including a gate that is coupled to word line WL-1 130a, a first source/drain region that is coupled to bit line BL*-1 128 and a second source/drain region that is coupled to the node 208.

Cross-coupling is accomplished by the gates of transistors 214 and 216 being coupled to the source/drains of transistors 218, 220 by resistor 224 at node 208, and by the gates of transistors 218 and 220 being coupled to the coupled source/drains of transistors 214, 216 by resistor 222 at node 206.

Pass transistors 210 and 212 when enabled, allow data to pass into and out of memory cell 124a. Row decoder 108 can selectively drive word line WL-1 130a to a high logic level to activate pass transistors 210 and 212. The row address is decoded by row decoder 108 such that one of X word lines is enabled, where X is the number of rows of memory cells in the memory, which is a function of memory density and architecture.

In operation, the voltages of nodes 206 and 208 will necessarily be logical complements of one another, due to the cross-coupled nature of CMOS inverters 202, 204 within memory cell 124a. When word line WL-1 130a is energized by the row decoder 108, according to the row address received at address inputs 118 from electronic system 104 coupled to the row decoder 108, pass transistors 210 and 212 can be turned on, coupling nodes 206 and 208 to bit lines BL-1 126a and BL*-1 128a, respectively. Accordingly, when word line WL-1 130a is high, the state of memory cell 124a can establish a differential voltage on BL-1 126a and BL*-1 128a.

Alternatively, peripheral circuitry such as, e.g., bit line drivers within input/output circuit 112 or sense amplifier 114, can force a voltage on BL-1 126a and BL*-1 128a to alter the state of memory cell 124a. The sizes of the transistors shown in FIG. 2 are generally chosen such that when pass transistors 210 and 212 are turned on by word line WL-1 130a during a cell write, a differentially low voltage at bit line BL-1 126a with respect to node 206 can force node 206 to a logic low level, and a differentially low voltage at bit line BL*-1 128a with respect to node 208 can force node 208 to a logic low level. However, the sizes of the transistors shown in FIG. 2 can also be chosen such that when transistors 210 and 212 are on, a differentially high voltage at bit line BL-1 126a with respect to node 206 will not force node 206 high, nor will differentially high voltage at bit line BL*-1 128a with respect to node 208 force node 208 high. Therefore writing into memory cell 124a is accomplished by pulling the desired bit line and thus the desired side of cell 124a at either node 206 or node 208 low, which in turn due to feedback paths in cell 124a, causes the opposite side of cell 124a to have a logic high state.

In operation, memory device 102 reads and writes data for electronic system 104.

For example, to read the value from memory cell 124-11, electronic system 104 can provide the address of memory cell 124-11 to row decoder 108 over address lines 118. Electronic system 104 can also provide control signals to control circuit 116 over control lines 120. Control circuit 116 can provide signals to sense amplifier 114 that can sense the relative voltages on bit line BL-1 126a and bit line BL*-1 128a. Additionally, by using bit lines in the manner described above, activation of pass transistor 210 can also change the voltage on bit line BL*-1 128a by an amount approximately equal in magnitude to the change on bit line BL-1 126a, but opposite in direction. With the charge on the bit line pair, sense amplifier 114 can next detect the logic state of cell 124a-11. Column decoder 110 can receive the column address of the selected cell from electronic system 104. Column decoder 110 can identify the appropriate bit line pair for sense amplifier 114 to use in reading the value from memory cell 124a-11. Sense amplifier 114 can sense and amplify the difference in voltage in the bit line pair and thus produce high and low logic levels on complementary nodes of sense amplifier 114 that correspond to the sensed bit line pair, BL-1 126a and BL*-1 128a, respectively. These voltage levels can be passed to electronic system 104 through input/output circuit 112 over input/output lines 122.

In a write operation, electronic system 104 can provide data to be written to, for example, memory cell 124a-11 over input/output lines 122 to input/output circuit 112. Column decoder 110 can receive the column address from electronic system 104 over address lines 118 to select the appropriate bit line pair for the selected memory cell. Sense amplifier 114, under the control of control circuit 116, can force the bit line pair, BL-1 126a and BL*-1 128a, for memory cell 124a-11 to complementary high and low logic levels based on the data to be stored in memory cell 124a-11. Row decoder 108 can receive an address from electronic system 104 over address line 118 that indicates the appropriate word line, WL-1 130a, to activate for this storage operation. When word line WL-1 130a is activated, pass transistors 210, 212 can cause the data on bit line BL-1 126a and bit line BL*-1 128a to be stored at nodes 206 and 208, respectively. In this process, the high and low logic levels for sense amplifier 114 are translated to appropriate voltage levels for memory cell 124a-11.

Figure 3:
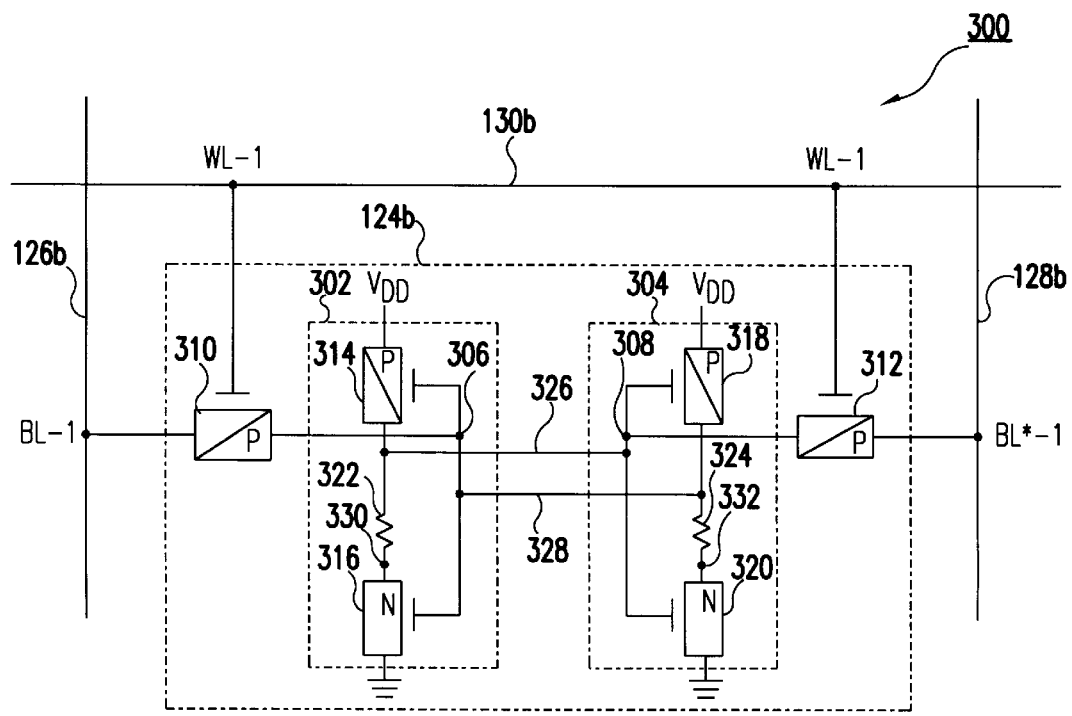
FIG. 3 is a schematic diagram of an exemplary embodiment of an improved radiation hardened SRAM memory cell according to the present invention.

FIG. 3 is a schematic diagram of an embodiment of memory cell 124b including the improved radiation hardening feature according to the present invention. Memory cell 124b in an improved SRAM 102 is illustrated in FIG. 3. FIG. 3 depicts a schematic drawing 300 that illustrates an improved radiation hardened CMOS random access memory (RAM) cell 124b omitting resistors 222 and 224 from memory cell 124a, adding resistors 322 and 324, and replacing NFET pass transistors 310 and 312 with PFET transistors 310 and 312. The resulting memory cell provides several advantages over the conventional memory cell described with reference to FIG.2. Schematic drawing 200 includes two CMOS inverters 302 and 304 wherein each CMOS inverter includes a lightly doped polysilicon resistor 322 and 324, respectively, formed coupling a source/drain region of both a p-channel transistor and an n-channel transistor included in each CMOS inverter 302 and 304.

First CMOS inverter 302 includes a p-channel transistor 314 and an n-channel transistor 316 coupled together by a resistor 322 at a source/drain region of transistors 314, 316, where the terminal of the resistor 322 which is coupled to the p-channel transistor 314 is also coupled to both gates of the transistors of second CMOS inverter 304 as shown by line 326. A second source/drain region of p-channel transistor 314 is coupled to source voltage VDD, and a second source/drain region of n-channel transistor 316 is coupled to ground. The gates of transistors 314 and 316 are coupled together at a node referred to as 306, are coupled to a first source/drain region of a p-channel pass transistor 310, and are coupled to a source/drain region of a p-channel transistor 318 of second CMOS inverter 304 as shown by line 328. Schematic diagram 300 further includes the p-channel pass transistor 310 including a gate that is coupled to word line WL-1 130b, a second source/drain region that is coupled to bit line BL-1 126b and the first source/drain region that is coupled to the node 306.

Second CMOS inverter 304 includes p-channel transistor 318 and an n-channel transistor 320 coupled together by a resistor 324 at source/drain regions of transistors 318, 320, where the terminal of the resistor 324 which is coupled to the p-channel transistor 318 is also coupled to both gates of the transistors of first CMOS inverter 302 as shown by line 328. A second source/drain region of p-channel. transistor 318 is coupled to source voltage VDD, and a second source/drain region of n-channel transistor 320 is coupled to ground. The gates of transistors 318 and 320 are coupled together at a node referred to as 308, which is coupled to a first source/drain region of a p-channel pass transistor 312, and coupled to the first source/drain region of p-channel transistor 314 of the first inverter 302 as shown by line 326. Schematic diagram 300 further includes an n-channel pass transistor 312 including a gate that is coupled to word line WL-1 130b, a second source/drain region that is coupled to bit line BL*-1 128b and the first source/drain region that is coupled to the node 308. The resistors 322 and 324 are respectively connected to nodes 330 and 332, which are the N+ diffusions of the drain regions of NFET transistors 316 and 320, respectively.

The values of resistors 322 and 324 can be chosen such that the source to drain resistance of p-channel transistors 314 and 318 is much smaller than resistors 322 and 324.

In response to a charged particle hitting an N+ diffusion at nodes 330 or 332, if either of the hit nodes was at VDD potential, the node is pulled toward ground (GND). The value of resistors 322 or 324 then determine the amount of current sunk into the node that has been pulled toward ground. Since resistors 322 and 324 are each larger (illustratively 1.5–20 times larger) than the source drain resistances of p-channel transistor 314 or p-channel transistor 318, there is no appreciable voltage droop on node 306 or 308 which are being pulled to VDD by a p-channel transistor (PFET). The value of the resistors 322 and 324 may be set much higher to prevent any appreciable droop on nodes 306 or 308. Conversely, the value of the resistors 322 and 324 may be set at the lower end of the range to merely keep nodes 306 and 308 above the switching threshold of the inverters 302 and 304. The resistors raise the immunity N+ diffusions of the memory cell to a single event upset.

The remaining exposed nodes are P+ diffusions in n-wells. In these cases, for a particle that strikes the memory cell at a given angle to the chip surface, more charge will be produced if the particle hits an N+ diffusion in the P–substrate than will be produced if the particle hits a P+ diffusion in an n-well. The amount of charge collected is a function of the thickness of the epitaxial layer and the thickness of the epitaxial layer is reduced at the P+ nodes because of the n-well.

The P+ nodes can be themselves hardened by providing a small gate to source/drain region overlap. This gate to source/drain region overlap can provide an additional Miller capacitance on the order of 0.2 to 0.5 pico-farads without appreciably increasing write delay. Examples of this overlap are shown illustratively in FIG. 4.

Cross-coupling is accomplished by the gates of transistors 314 and 316 being coupled by line 328 to the source/drain region of transistor 318 and the terminal of resistor 324, and by the gates of transistors 318 and 320 being coupled by line 326 to the source/drain region of transistor 314 and the terminal of resistor 322.

Pass transistors 310 and 312 when enabled, allow data to pass into and out of memory cell 124*b*. Row decoder 108 can selectively drive word line WL-1 130*b* to a high logic level to activate pass transistors 310 and 312. The row address can be decoded by row decoder 108 such that one of X word lines is enabled, where X is the number of rows of memory cells in the memory, which is a function of memory density and architecture.

In operation, the voltages of nodes 306 and 308 will necessarily be logical complements of one another, due to the cross-coupled nature of CMOS inverters 302 and 304 within memory cell 124*b*. When word line WL-1 130*b* is energized by the row decoder 108, according to the row address received at address inputs 118 from electronic system 104 coupled to the row decoder 108, pass transistors 310 and 312 can be turned on, coupling nodes 306 and 308 to bit lines BL-1 126*b* and BL*-1 128*b*, respectively. Accordingly, when word line WL-1 130*b* is high, the state of memory cell 124*b* can establish a differential voltage on BL-1 126*b* and BL*-1 128*b*.

Alternatively, peripheral circuitry such as, e.g., bit line drivers within input/output circuit 112 or sense amplifier 114, can force a voltage on BL-1 126*b* and BL*-1 128*b* to alter the state of memory cell 124*b*. The sizes of the transistors shown in FIG. 3 are generally chosen such that when pass transistors 310 and 312 are turned on by word line WL-1 130*b* during a cell write, a differentially low voltage at bit line BL-1 126*b* with respect to node 306 can force node 306 to a logic low level, and a differentially high voltage at bit line BL*-1 128*b* with respect to node 308 can force node 308 to a logic high level. However, the sizes of the transistors shown in FIG. 3 can also be chosen such that when transistors 310 and 312 are on during a cell read, a high voltage at bit lines BL-1 126*b* and BL*-1 128*b* with respect to nodes 306 and 308 respectively will not flip the value stored in the cell. Writing into memory cell 124*b* is accomplished by pulling the desired bit line and thus the desired side of cell 124*b* at either node 306 or node 308 low, which in turn due to feedback paths in cell 124*b* and the other bit line, can cause the opposite side of cell 124*b* to have a logic high state.

In operation, memory device 102 reads and writes data for electronic system 104.

For example, to read the value from memory cell 124-11, electronic system 104 can provide the address of memory cell 124-11 to row decoder 108 over address lines 118. Electronic system 104 can also provide control signals to control circuit 116 over control lines 120. Control circuit 116 can provide signals to sense amplifier 114 that can sense the relative voltages on bit line BL-1 126*b* and bit line BL*-1 128*b*. Additionally, by using bit lines in the manner described above, activation of pass transistor 310 can also change the voltage on bit line BL*-1 128*b* by an amount approximately equal in magnitude to the change on bit line BL-1 126*b*, but opposite in direction. With the charge on the bit line pair, sense amplifier 114 can next detect the logic state of cell 124*b*- 11. Column decoder 110 can receive the column address of the selected cell from electronic system 104. Column decoder 110 can identify the appropriate bit line pair for sense amplifier 114 to use in reading the value from memory cell 124*b*-11. Sense amplifier 114 can sense and amplify the difference in voltage in the bit line pair and thus produce high and low logic levels on complementary nodes of sense amplifier 114 that correspond to the sensed bit line pair, BL- 1 126*b* and BL*- 1 128*b*, respectively. These voltage levels can be passed to electronic system 104 through input/output circuit 112 over input/output lines 122.

In a write operation, electronic system 104 can provide data to be written to, for example, memory cell 124*b*-11 over input/output lines 122 to input/output circuit 112. Column decoder 110 can receive the column address from electronic system 104 over address lines 118 to select the appropriate bit line pair for the selected memory cell. Sense amplifier 114, under the control of control circuit 116, can force the bit line pair, BL-1 126*b* and BL*-1 128*b*, for memory cell 124*b*-11 to complementary high and low logic levels based on the data to be stored in memory cell 124*b*-11. Row decoder 108 can receive an address from electronic system 104 over address line 118 that indicates the appropriate word line, WL-1 130*b*, to activate for this storage operation. When word line WL-1 130*b* is activated, pass transistors 310, 312 can cause the data on bit line BL-1 126*b* and bit line BL*-1 128*b* to be stored at nodes 306 and 308, respectively. In this process, the high and low logic levels for sense amplifier 114 are translated to appropriate voltage levels for memory cell 124*b*-11.

A method for hardening a memory cell against an SEU can include reducing the amount of charge generated by a given event. This can for example be accomplished by using a silicon film thinner than a collection depth in bulk material. For example, a memory cell created on a thin film of semiconductor, such as in an silicon on insulator (SOI) device, can be less susceptible to a SEU than one created on bulk semiconductor, such as silicon, because ionization charge along a path in an insulator is more likely to recombine than be collected as compared to an ionization charge created in a semiconductor.

Another method of reducing the susceptibility of a memory cell to upset is by increasing the critical charge of the cell.

FIG. 2 discussed above, depicts a radiation hardening scheme against a SEU in static memory cells based on increasing the critical charge required to produce a SEU. As described above, resistors 222 and 224 are included in the cross-coupling lines of inverters 202 and 204 and they increase the RC time constant delay associated with the gate capacitances of transistors 214, 216, 218 and 226. The initial effect of an energetic particle strike in a critical volume is to change the voltage of one node of the memory cell, say node 206. Upset will occur if this change in voltage propagates through the cross coupling of inverters 202 and 204 before the initial voltage of node 206 is restored. The increased RC delay slows the feedback propagation through the cross coupling and allows more time for recovery of the initially affected node. However, this increase in RC propagation delay also slows the write cycle time of cell 124*a*. The write cycle of a static memory cell in a static random access memory (SRAM) is typically faster than the read cycle so that some slowing of the write cycle is acceptable, since the read cycle time was the most critical. However, with scaling of memory cells to small geometries, the speed of the write cycle of SEU hardened cells has become more important.

In the SRAM cell of the present invention, shown in FIG. 3, resistors 322 and 324 are introduced to protect against hits on the n-channel transistors 316 and 320 of the inverters 302 and 304 as shown in the schematic drawing of FIG. 3.

Figure 4:
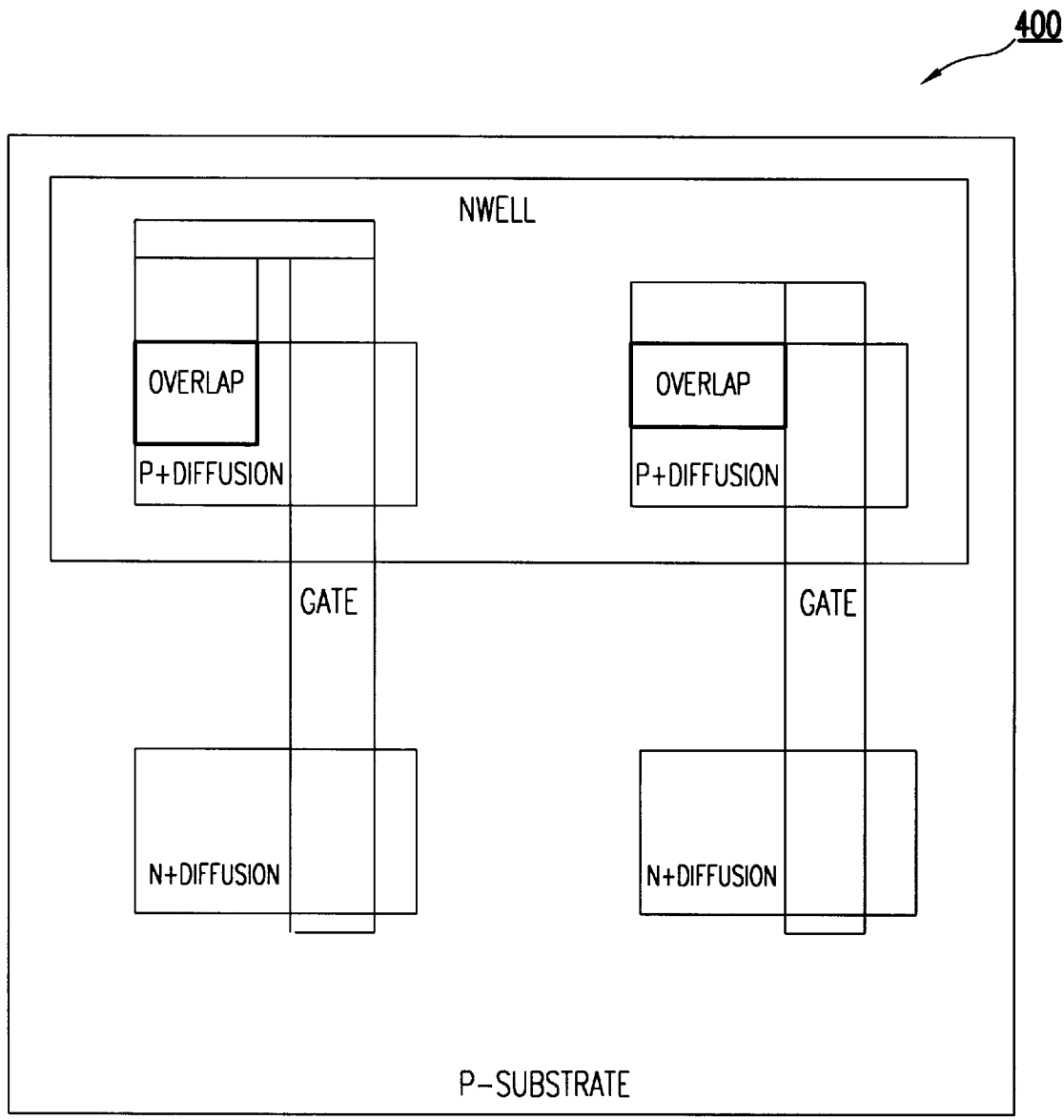
FIG. 4 is an exemplary top view of a semiconductor structure illustratively depicting examples of the small gate to source/drain region overlap providing additional capacitance without appreciably increasing write delay according to the claimed invention.

Another hardening scheme against a SEU can be based on increasing the critical charge by increasing the capacitance on the inverter source/drain regions, thus decreasing the voltage change on the node for a given amount of collected charge. The capacitance on nodes 306 and 308 may be increased by laying out the circuit to include additional capacitance to a VDD or GND node. In a preferred embodiment of the invention, overlap capacitance between the gate and drain of the inverter is included as shown in FIG. 4. This overlap capacitance between gate and drains of the cross coupled inverters is subject to the Miller effect which multiplies the effective value of the capacitance by a gain factor. Moreover, some of the voltage change from a particle hit is coupled through the overlap capacitance. This tends to split deposited charge between opposing nodes of the cross-coupled inverters 302 and 304 thus reducing the effect of the hit. Also, with the capacitance from gate to drain, a change in the drain voltage can induce a change in the gate voltage such that the restoring current can be increased. Increased capacitance of the gate also increases the RC delay in the feed back path, which itself can increase resistance to a SEU. The increased capacitance also slows cell writes. However, so long as the resistance in the cross-coupling is small, this slowing effect is minimal or negligible. Thus, capacitance between a gate and source/drain region reduces the rate of SEU.

The present invention depicted in FIG. 3 can use active devices, such as a pair of p-channel transistors 310, 312 (preferably metal oxide semiconductor (MOS) transistors in order to fit compactly and conserve space in a memory cell) as pass transistors of a memory cell. FIG. 3 discussed above depicts a schematic drawing of an integrated circuit which includes an embodiment of the invention. For optimal SEU hardness, the memory cell can be built on an insulator body (although it can be built on bulk semiconductor material as well) and thus can be classified as an SOI device. In an embodiment of the present invention, it can be advantageous if at least the devices in the cross-coupling can be isolated from the bulk semiconductor as can be done with stacked polysilicon transistors. FIG. 3 depicts a schematic drawing having p-channel pass transistors 310 and 312 coupled to an associated cross-coupling line 326 and 328, respectively, joining a gate of one inverter to the drain of the other inverter. Specifically, the source drain region of transistor 310 is coupled to the gates of p-channel transistor 314 and n-channel transistor 316 of inverter 302, and by line 328 to a source/drain terminal of p-channel transistor 318 and a terminal of resistor 324 coupling transistor 318 to a source/drain terminal of n-channel transistor 320 of inverter 304.

An example operation of cell 124*b* of FIG. 3 can now be described with reference to the figure. For the case where node 308 is initially logic high and node 306 is initially logic low, when attempting to write the opposite state into memory cell 124*b*, node 308 can first be pulled to logic low. This logic low transition can be transmitted through transistor 312 which is in its most turned on state, to the common gate of transistors 318 and 320. Node 306 is changed from its initial logic low state to a logic high state in response to a low voltage at the gates of transistors 318 and 320 causing line 328 to transition to logic high to the common gate of transistors 314 and 316. Similarly, the transition of node 306 from low to high can be transmitted through transistor 314, causing the source/drain terminal of transistor 314 to be in a logic low. The transition of node 306 from low to high takes a source/drain terminal of pass transistor 310 to a higher conducting state (logic low). Note that while the WRITE is accomplished through transistors 312 and 310 in their most turned on state, the voltage maintaining feedback in memory cell 124*b* can always run through lines 326. This feedback can alternatively be maintained by leakage or subthreshold current, meaning that enhancement mode transistors or depletion mode transistors can be used as transistors 310 and 312.

If transistors 314 or 318 are hit by a particle which changes the logic state at the output of an inverter, memory cell 124*b* can recover from the hit due primarily to the added resistance between source/drain regions of transistors 314 and 318 when each is in its lower conducting state. The added resistance prevents appreciable voltage droop on nodes 306 and 308 when an N+ diffusion is hit. The added resistance introduces an RC delay in response to a P+ diffusion hit therefore allowing more time for recovery before the negative effect of the SEU induced voltage change propagates through memory cell 124*b*. Providing drain-supply (VDD or GND) or gate-drain capacitance further increases the hardness of the cell to radiation. Resistors 322 and 324 provide resistive barriers to limit the amount of voltage drop occurring at nodes 308 and 306 resulting from a sufficiently charged hit on n-channel transistors 316 and 320, respectively. Although the capacitance and resistance provided by transistors 310 and 312 reduce the rate of SEU caused by hits on n-channel transistors 316, 318 to some degree, resistors 322 and 324 account for a significant increase in critical charge necessary to upset the cell due to a hit on n-channel transistors 316 and 320. With respect to a hit on a P+ diffusion, the critical charge may be increased 10 times with respect to a hit on the N+ diffusions, the critical charge may, in theory, be infinitely increased or as the effect of the hit is isolated by one of the resistors 322 or 324.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents. The present application is intended to cover any adaptations or variations of the present invention. For example, the high and low logic values selected for the bit line pairs may be varied from the specified voltage levels. Electronic circuits shown in the various embodiments and the methods of operation described are shown by way of example. Other circuits that effectively perform the functions and steps described can be substituted. Further, the present invention is not limited to use with only the circuits and devices described herein.

What is claimed is:

1. A radiation hardened storage cell, comprising in combination:
   a first inverter pair comprised of a first PFET and a first NFET coupled in series drain to drain by a resistor whose resistance is an order of magnitude larger than the source to drain resistance of the first PFET;
   said first PFET including a P+ drain diffusion in an NWELL with a portion of the gate overlying the P+ drain diffusion;
   a second inverter pair comprised of a second PFET and a second NFET coupled in series drain to drain by a resistor whose resistance is an order of magnitude larger than the source to drain resistance of the second PFET;
   said second PFET including a P+ drain diffusion in an NWELL with a portion of the gate overlying the P+ drain diffusion;
   a first pass gate PFET coupled to the gate of said first PFET, the gate of said first NFET, and the P+ drain diffusion of said second PFET; and
   a second pass gate PFET coupled to the gate of said second PFET, the gate of said second NFET, and the P+ drain diffusion of said first PFET.

2. The storage cell according to claim 1, wherein said portions of the gate overlying the P+ drain diffusion provide additional capacitance.

3. The storage cell according to claim 2, wherein the additional capacitance is between 0.2 and 0.5 pico-farads.

4. A radiation hardened storage cell, comprising:
   a first inverter including a first PFET and a first NFET having commonly coupled gates and separate drains, the drain of said first PFET including a P+ drain diffusion in an NWELL with a portion of the gate overlying the P+ drain diffusion;
   a second inverter including a second PFET and a second NFET having commonly coupled gates and separate drains, the drain of said second PFET including a P+ drain diffusion in an NWELL with a portion of the gate overlying the P+ drain diffusion;
   first and second resistors coupling the P+ drain diffusions of the first and second PFETs respectively to the drains of the first and second NFETs;
   a first pass gate PFET having a drain coupled to the commonly coupled gates of said first inverter and the P+ drain diffusion of said second PFET; and
   a second pass gate PFET having a drain coupled to the commonly coupled gates of said second inverter and the P+ drain diffusion of said first PFET.

5. The storage cell according to claim 4, wherein each of said first and second PFETs have a source to drain resistance that is smaller in value than a value of a corresponding one of said resistors.

6. The storage cell according to claim 5, wherein the value of each of said resistors is an order of magnitude larger than the source to drain resistance of each of said first and second PFETs.

7. The storage cell according to claim 5, wherein the value of each of said resistors is selected to raise an immunity of the storage cell to single event upset.

8. The storage cell according to claim 4, wherein said portions of the gate overlying the P+ drain diffusion provide additional capacitance.

9. The storage cell according to claim 8, wherein the additional capacitance is selected to raise an immunity of the cell to single event upset.

10. The storage cell according to claim 8, wherein the additional capacitance is 0.2–0.5 pico-farads.

11. A memory device, comprising:
    addressing circuitry;
    an array of word lines and complementary bit line pairs coupled to the addressing circuitry;
    a plurality of storage cells located at the intersection of selected word lines and bit line pairs;
    a sense amplifier coupled to the complementary bit line pairs; and
    wherein each of said plurality of storage cells comprises:
       a first inverter including a first PFET and a first NFET having commonly coupled gates and separate source/drain regions, the source/drain region of said first PFET including a P+ drain diffusion in an NWELL with a portion of the gate overlying the P+ drain diffusion;
       a second inverter including a second PFET and a second NFET having commonly coupled gates and separate source/drain regions, the source/drain region of said second PFET including a P+ drain diffusion in an NWELL with a portion of the gate overlying the P+ drain diffusion;
       first and second resistors coupling the P+ drain diffusions of the first and second PFETs respectively to the source/drain regions of the first and second NFETs;
       a first pass gate PFET having a source/drain region coupled to the commonly coupled gates of said first inverter and the P+ drain diffusion of said second PFET; and
       a second pass gate PFET having a source/drain region coupled to the commonly coupled gates of said second inverter and the P+ drain diffusion of said first PFET.

12. An apparatus, comprising:
    an electronic system; and
    a memory device coupled to said electronic system, wherein said memory device includes a radiation hardened storage cell, having:
       a first inverter including a first PFET and a first NFET having commonly coupled gates and separate source/drain regions, the source/drain region of said first PFET including a P+ drain diffusion in an NWELL with a portion of the gate overlying the P+ drain diffusion;
       a second inverter including a second PFET and a second NFET having commonly coupled gates and separate source/drain regions, the source/drain region of said second PFET including a P+ drain diffusion in an NWELL with a portion of the gate overlying the P+ drain diffusion;
       first and second resistors coupling the P+ drain diffusions of the first and second PFETs respectively to the source/drain regions of the first and second NFETs;
       a first pass gate PFET having a source/drain region coupled to the commonly coupled gates of said first inverter and the P+ drain diffusion of said second PFET; and
       a second pass gate PFET having a source/drain region coupled to the commonly coupled gates of said second inverter and the P+ drain diffusion of said first PFET.

13. The apparatus of claim 12, wherein each of said first and second PFETs have a source to drain resistance that is smaller in value than a value of a corresponding one of said resistors.

14. The apparatus of claim 13, wherein the value of each of said resistors is an order of magnitude larger than the source to drain resistance of each of said first and second PFETs.

15. The apparatus of claim 13, wherein the value of each of said resistors is selected to raise an immunity of the memory cell to single event upset.

16. The apparatus of claim 12, wherein said portions of the gate overlying the P+ drain diffusion provide additional capacitance.

17. The apparatus of claim 12, wherein the electronic system comprises a microprocessor.

18. The apparatus of claim 16, wherein the additional capacitance is selected to raise an immunity of the cell to single event upset.

19. The apparatus of claim 16, wherein the additional capacitance is 0.2–0.5 pico-farads.

20. A method of operating a radiation hardened storage cell comprising:

sustaining a SEU event particle hit on a node of the storage cell which changes the logic state at the output of an inverter of the storage cell;

recovering from a critical charge deposited on the storage cell as a result of the SEU event on the node; and increasing RC delay slowing feedback propagation through cross-coupled inverter pair allowing more time for recovery wherein write cycle time is not appreciably affected.

21. The method of claim 20, including at least one of the following:

increasing the immunity of critical charge deposition and decreasing the voltage change on the struck node by increasing capacitance on an inverter source/drain region;

limiting the amount of voltage drop using a resistive barrier to protect against N+ transistor hits; and generating additional charge from overlap capacitance between gate and drain regions of cross-coupled inverters wherein some of the voltage change from the particle hit can be coupled through said overlap capacitance splitting deposited charge between opposing nodes of the cross-coupled inverters.

* * * * *